United States Patent
Wu et al.

(10) Patent No.: US 12,525,452 B2
(45) Date of Patent: Jan. 13, 2026

(54) SEMICONDUCTOR STRUCTURE AND METHOD FOR FABRICATING SAME

(71) Applicant: CHANGXIN MEMORY TECHNOLOGIES, INC., Hefei (CN)

(72) Inventors: Gongyi Wu, Hefei (CN); Xiaofei Wu, Hefei (CN); Yachao Xu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 731 days.

(21) Appl. No.: 17/971,632

(22) Filed: Oct. 23, 2022

(65) Prior Publication Data
US 2023/0125245 A1  Apr. 27, 2023

(30) Foreign Application Priority Data
Oct. 25, 2021  (CN) .......................... 202111242965.8

(51) Int. Cl.
| | |
|---|---|
| H01L 21/223 | (2006.01) |
| H01L 21/3213 | (2006.01) |
| H01L 23/522 | (2006.01) |
| H01L 23/528 | (2006.01) |
| H01L 23/532 | (2006.01) |
| H10B 12/00 | (2023.01) |

(52) U.S. Cl.
CPC ...... *H01L 21/223* (2013.01); *H01L 21/32135* (2013.01); *H01L 23/5226* (2013.01); *H01L 23/5283* (2013.01); *H01L 23/53271* (2013.01); *H10B 12/01* (2023.02)

(58) Field of Classification Search
CPC ............. H01L 23/5226; H01L 23/5283; H01L 21/76831; H01L 21/76877; H01L 23/53271; H01L 21/76832; H01L 21/76864
See application file for complete search history.

(56) References Cited

U.S. PATENT DOCUMENTS

| | | | | |
|---|---|---|---|---|
| 5,552,340 A | * | 9/1996 | Lee .................. | H01L 21/76877 438/653 |
| 7,112,488 B2 | * | 9/2006 | Helm .................... | H10B 41/35 438/257 |
| 9,698,232 B2 | * | 7/2017 | Yang .................... | H01L 23/528 |
| (Continued) | | | | |

FOREIGN PATENT DOCUMENTS

CN   112750754 A   5/2021

*Primary Examiner* — Bac H Au
(74) *Attorney, Agent, or Firm* — Kilpatrick Townsend & Stockton LLP (57) ABSTRACT

Embodiments discloses a semiconductor structure and a fabricating method. The method includes: forming a contact hole on a substrate; forming a first doped layer on a surface of the contact hole, and annealing the first doped layer; forming at least one second doped layer on the first doped layer, and annealing each of the at least one second doped layer; and forming a third doped layer on the at least one second doped layer to fill up the contact hole. A thickness of the at least one second doped layer is greater than a thickness of the third doped layer, and the thickness of the third doped layer is greater than the thickness of the first doped layer. Annealing not only can repair lattice mismatch and lattice defect in the first doped layer/second doped layer, but also can improve surface roughness of the first doped layer/second doped layer.

10 Claims, 8 Drawing Sheets

(56) References Cited

U.S. PATENT DOCUMENTS

| | | | | |
|---|---|---|---|---|
| 9,704,798 | B2* | 7/2017 | Govindaraju | H01L 23/5226 |
| 2001/0029094 | A1* | 10/2001 | Mee-Young | H01L 21/76843 |
| | | | | 257/E21.585 |
| 2003/0116798 | A1* | 6/2003 | Park | H10D 1/047 |
| | | | | 257/E21.396 |
| 2003/0205748 | A1* | 11/2003 | Park | H10B 12/0383 |
| | | | | 257/E21.396 |
| 2006/0124982 | A1* | 6/2006 | Ho | H10D 84/212 |
| | | | | 257/E21.396 |
| 2012/0070982 | A1* | 3/2012 | Yu | H01L 21/76843 |
| | | | | 438/653 |
| 2020/0312871 | A1* | 10/2020 | Xiao | H10B 43/27 |
| 2022/0059539 | A1* | 2/2022 | Wu | H10B 12/053 |
| 2022/0172749 | A1* | 6/2022 | Ma | H10B 12/315 |
| 2023/0284458 | A1* | 9/2023 | Zhang | H10N 50/80 |
| | | | | 257/421 |

* cited by examiner

SEMICONDUCTOR STRUCTURE AND METHOD FOR FABRICATING SAME

CROSS-REFERENCE TO RELATED APPLICATION

This application claims priority to Chinese Patent Application No. 202111242965.8, titled "SEMICONDUCTOR STRUCTURE AND METHOD FOR FABRICATING SAME" and filed to the State Patent Intellectual Property Office on Oct. 25, 2021, the entire contents of which are incorporated herein by reference.

TECHNICAL FIELD

Embodiments of the present disclosure relate to the field of semiconductor structure and fabrication technology, and more particularly, to a semiconductor structure and a method for fabricating the same.

BACKGROUND

A dynamic random access memory (DRAM) is a semiconductor memory widely used in multi-computer systems. With shrinking of feature dimensions of semiconductor integrated circuit devices, critical dimensions of the DRAM are getting smaller and smaller, and a depth-to-width ratio of a contact hole is getting larger and larger. However, a method for filling the contact hole in the related technologies easily leads to pores in the contact hole, which adversely affects yield of the devices.

SUMMARY

Embodiments of the present disclosure provide a semiconductor structure and a method for fabricating the same.

The method for fabricating the semiconductor structure according to the embodiments of the present disclosure includes: forming a contact hole on a substrate; forming a first doped layer on a surface of the contact hole, and annealing the first doped layer; forming at least one second doped layer on the first doped layer, and annealing each of the at least one second doped layer; and forming a third doped layer on the at least one second doped layer to fill up the contact hole. A thickness of the at least one second doped layer is greater than a thickness of the third doped layer, and the thickness of the third doped layer is greater than a thickness of the first doped layer.

The method for fabricating the semiconductor structure according to the embodiments of the present disclosure includes: forming a contact hole on a substrate; forming a first doped layer on a surface of the contact hole, and annealing and etching the first doped layer, such that a thickness of the first doped layer positioned at an upper part of the contact hole is less than a thickness of the first doped layer positioned at a lower part of the contact hole after etching; forming at least one second doped layer on a surface of the first doped layer, and annealing and etching the at least one second doped layer after each of the at least one second doped layer is formed, such that a thickness of the at least one second doped layer positioned at the upper part of the contact hole is less than a thickness of the at least one second doped layer positioned at the lower part of the contact hole after etching; and forming a third doped layer on the at least one second doped layer to fill up the contact hole; wherein the thickness of the at least one second doped layer is greater than a thickness of the third doped layer, and the thickness of the third doped layer is greater than the thickness of the first doped layer.

The semiconductor structure in the embodiments of the present disclosure includes: a substrate comprising a contact hole; a first doped layer provided on a surface of the contact hole, wherein a thickness of the first doped layer positioned at an upper part of the contact hole is less than a thickness of the first doped layer positioned at a lower part of the contact hole; at least one second doped layer provided on a surface of the first doped layer, wherein a thickness of the at least one second doped layer positioned at the upper part of the contact hole is less than a thickness of the at least one second doped layer positioned at the lower part of the contact hole; and a third doped layer provided on a surface of the at least one second doped layer and filling up the contact hole, wherein a thickness of the third doped layer positioned at the upper part of the contact hole is greater than a thickness of the third doped layer positioned at the lower part of the contact hole.

Reference numerals in the accompanying drawings:
100—substrate; 110—contact hole; 120—bit line; 130—first spacer layer; 140—second spacer layer; 150—third spacer layer; 160—fourth spacer layer; 170—fifth spacer layer; 200—first doped layer; 300—second doped layer; and 400—third doped layer

DETAILED DESCRIPTION

Exemplary embodiments will now be described more comprehensively with reference to the accompanying drawings. However, exemplary embodiments can be implemented in many forms. It shall not be understood that the present disclosure is limited to embodiments as set forth herein; instead, these embodiments are provided to ensure the present disclosure to be more comprehensive and complete. And the conception of these exemplary embodiments shall be conveyed to those skilled in the art across-the-board. Throughout the drawings, similar reference signs indicate the same or similar structures, and thus their detailed description will be omitted.

Figure 1:
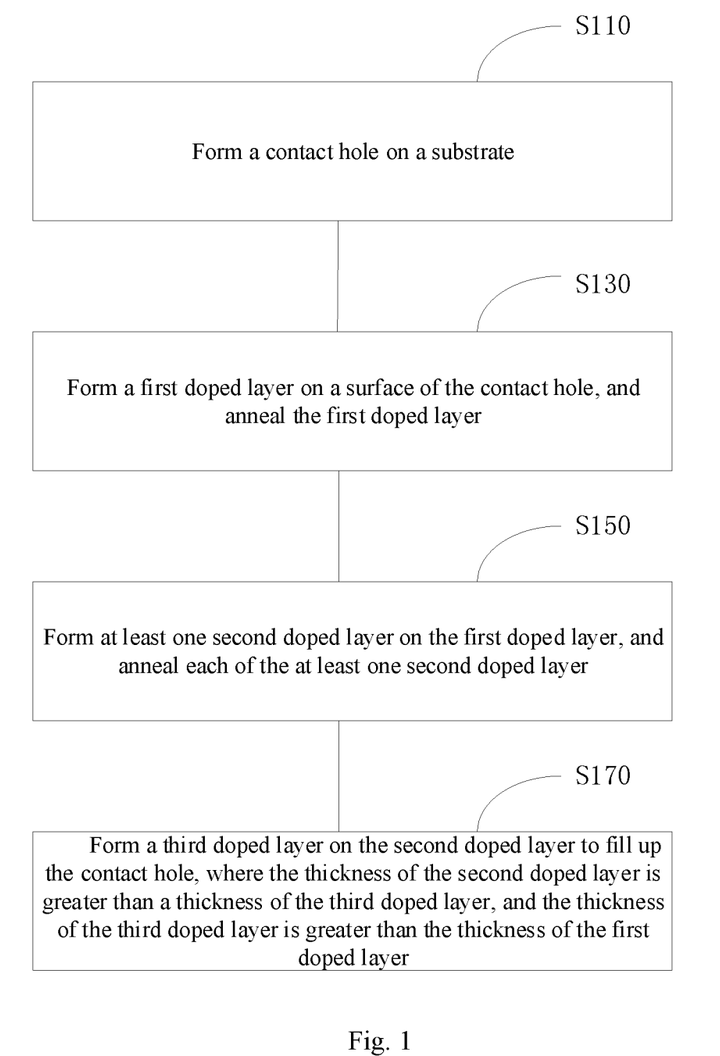
FIG. 1 is a flow diagram of a method for fabricating a semiconductor structure according to an embodiment of the present disclosure.

As shown in FIG. 1, FIG. 1 is a flow diagram of a method for fabricating a semiconductor structure according to an embodiment of the present disclosure. The method for fabricating the semiconductor structure according to the embodiments of the present disclosure includes following step.

Step S110: forming a contact hole on a substrate.

Step S130: forming a first doped layer on a surface of the contact hole, and annealing the first doped layer.

Step S150: forming at least one second doped layer on the first doped layer, and annealing each of the at least one second doped layer.

Step S170, forming a third doped layer on the at least one second doped layer to fill up the contact hole.

A thickness of the at least one second doped layer is greater than a thickness of the third doped layer, and the thickness of the third doped layer is greater than a thickness of the first doped layer.

In the method for fabricating the semiconductor structure according to the embodiments of the present disclosure, the first doped layer, at least one second doped layer, and the third doped layer are formed in the contact hole, and annealing treatment is performed after the first doped layer and the second doped layer are formed. Therefore, in one aspect, the lattice mismatch and lattice defects in the first doped layer/second doped layer can be repaired. In another aspect, the surface roughness of the first doped layer/second doped layer can be improved, such that the grain growth on the first doped layer/second doped layer is more uniform, thereby improving the sealing problem occurring after the first doped layer/second doped layer is formed, avoiding the formation of pores in the contact hole, forming a good filling effect, and improving yield and performance of a device.

Figure 2:
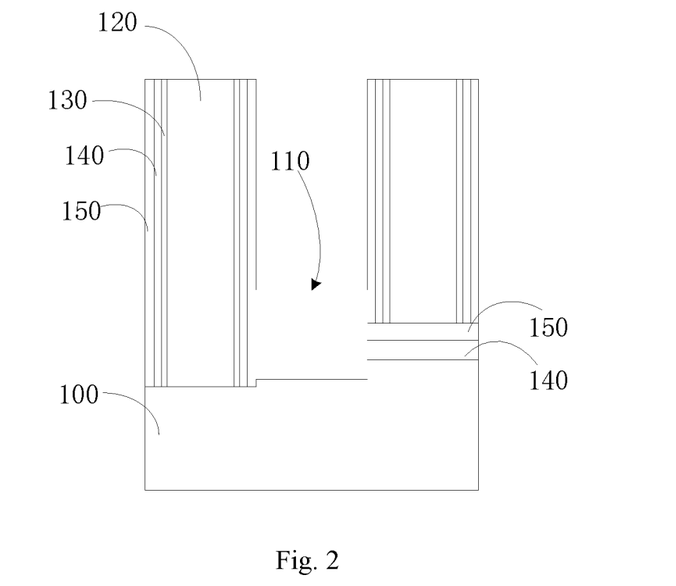
FIGS. 2 to 7 are schematic structural diagrams of steps of a method for fabricating a semiconductor structure according to an embodiment of the present disclosure.

As shown in FIG. 2, a contact hole 110 is formed on the substrate 100. It is to be understood that the substrate 100 may be a semiconductor substrate. For example, the substrate 100 may include a silicon substrate, a germanium substrate, a germanium-silicon substrate, and a silicon carbide substrate, etc. When applied to a dynamic random access memory (DRAM), the substrate 100 may also include a word line (WL) and a bit line (BL) 120. The contact hole 110 is formed in a region between adjacent bit lines 120. A first spacer layer 130 is provided on two sides of the bit line 120, a second spacer layer 140 is formed on a side wall of the first spacer layer 130, and a third spacer layer 150 is formed on a side wall of the second spacer layer 140.

In an embodiment, a material of the first spacer layer 130 and a material of the third spacer layer 150 may be the same, and are different from a material of the second spacer layer 140. For example, the material of the first spacer layer 130 and the material of the third spacer layer 150 include silicon nitride, and the material of the second spacer layer 140 includes silicon oxide, such that the first spacer layer 130, the second spacer layer 140, and the third spacer layer 150 form an N—O—N isolation structure (a silicon nitride-silicon oxide-silicon nitride isolation structure). The first spacer layer 130, the second spacer layer 140, and the third spacer layer 150 may be configured to protect the bit line 120, and may also isolate the bit line 120 from subsequent polysilicon layers.

Of course, in another embodiment, the isolation structures on two sides of the bit line 120 may also include two isolation layers, such as an O-N isolation structure (a silicon oxide-silicon nitride isolation structure). For example, the material of the first spacer layer 130 includes silicon nitride, and the material of the second spacer layer 140 includes silicon oxide.

It should be noted that, the shallow trench isolation structure, the doped region, or other semiconductor structure, etc. may also be formed in the substrate 100, which is not limited by the present disclosure. In addition, the related structures not indicated in FIG. 2 to FIG. 7 may be existing semiconductor structures (such as related structures required for forming the contact hole 110), which is not limited by the present disclosure.

Figure 3:
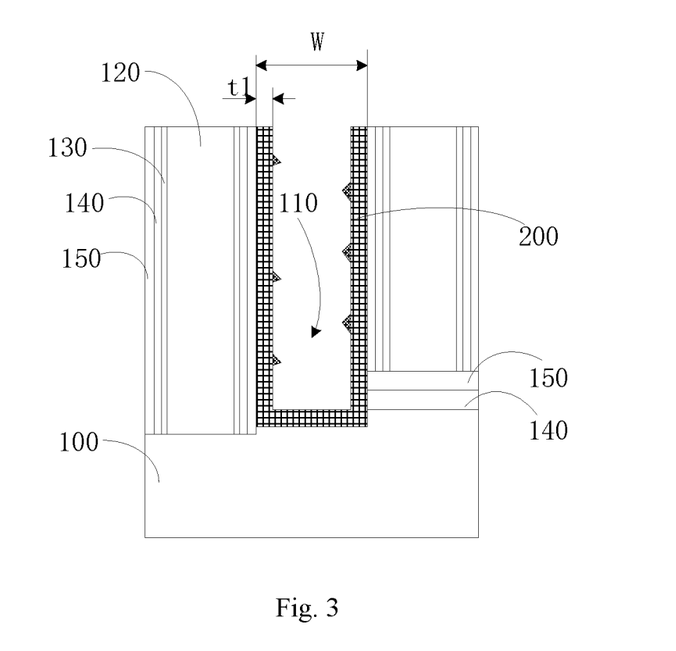

With continued reference to FIG. 3, the bit line 120 is provided on two sides of the contact hole 110 respectively. A bottom of one bit line 120 extends into the substrate 100, and a bottom surface of the bit line 120 is deeper than that of the contact hole 110. Moreover, because the bit line 120 extends into the substrate 100, the contact hole 110 also extends into the substrate 100, and thus the contact hole 110 may contact an active area within the substrate 100. The third spacer layer 150 and the second spacer layer 140 are further provided at the bottom of the other bit line 120 to isolate the bit line 120 from the substrate 100.

Figure 4:
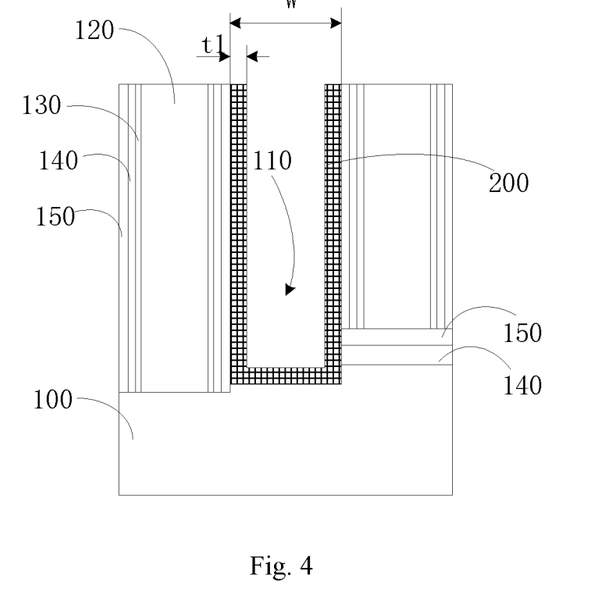

As shown in FIG. 3 and FIG. 4, a first doped layer 200 is formed on a surface of the contact hole 110, and the first doped layer 200 is annealed. By annealing the first doped layer 200, in one aspect, lattice mismatch and lattice defect in the first doped layer 200 can be repaired. In another aspect, the surface roughness of the first doped layer 200 can be improved, such that the grain growth on the first doped layer 200 is more uniform, thereby preventing the sealing problem from occurring after the first doped layer 200 is formed, and thus avoiding the formation of pores in the contact hole 110.

In an embodiment, a material of the first doped layer 200 may include polysilicon.

For example, steps of forming the first doped layer 200 may include: placing the substrate 100 including the contact hole 110 in a furnace body, then introducing silane into the furnace body to form a polysilicon layer on the surface of the contact hole 110, and introducing a dopant gas into the furnace body simultaneously, to finally form the first doped layer 200.

In an embodiment, the polysilicon layer may be ion-doped by means of ion implantation or diffusion process to form the first doped layer 200.

In an embodiment, a doping concentration of the first doped layer 200 may be $8*10^{20}$ cm$^{-2}$ to $30*10^{20}$ cm$^{-2}$. Under this doping concentration, a contact resistance of a contact interface between the first doped layer 200 and the active area in the substrate 100 may be reduced, thereby reducing a resistance of the device, and improving the performance of the device.

In an embodiment, the first doped layer 200 may include P-type or N-type doping material.

After the first doped layer 200 is formed, nitrogen gas may be introduced into the furnace body to anneal the first doped layer 200. It should be noted that, in this embodiment, the formation of the first doped layer 200 and the annealing of the first doped layer 200 are completed in the same furnace body, such that the working efficiency can be improved. Moreover, introducing the nitrogen gas can ensure that the first doped layer 200 is not oxidized, thereby ensuring the conductivity of the first doped layer 200, and further improving the performance of the device. In an embodiment, the annealing temperature of the first doped layer 200 is between 500° C. and 700° C., for example, between 550° C. and 650° C.; and the annealing time of the first doped layer 200 is between 0.5 h and 3 h, for example, between 1 h and 2 h. The temperature at which the first doped layer 200 is formed and the annealing temperature of the first doped layer 200 may be substantially the same, such that the formation and annealing of the first doped layer 200 may be completed within the same temperature range, and thus operation steps are saved.

With continued reference to FIG. 3 and FIG. 4, an original pore of the contact hole 110 is W (that is, a width of the contact hole 110 is W) before the first doped layer 200 is formed on the surface of the contact hole 110. The thickness of the first doped layer 200 formed is t1. A ratio of the thickness of the first doped layer 200 to the original pore of the contact hole 110 is between 5% and 12.5%. That is, t1/W=5% to 12.5%. For example, t1/W=10%. Because the doping concentration of the first doped layer 200 is in a range from $8*10^{20}$ cm$^{-2}$ to $30*10^{20}$ cm$^{-2}$, the surface roughness of the first doped layer 200 is poorer at a higher doping concentration, so the ratio of the thickness of the first doped layer 200 to the original pore of the contact hole 110 is designed to be 5% to 12.5%.

Figure 5:
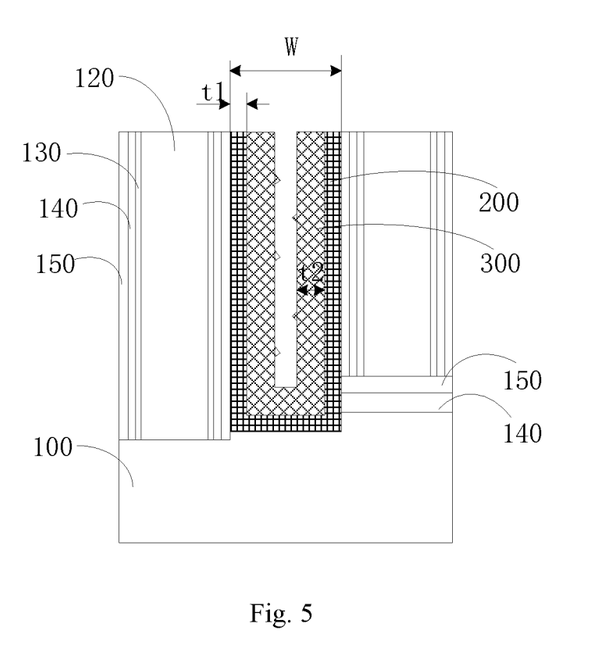
Figure 6:
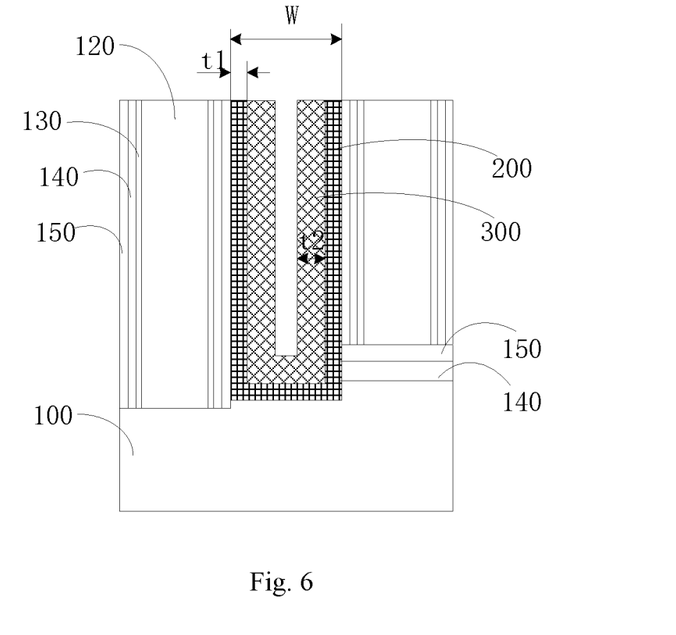

As shown in FIG. 5 and FIG. 6, at least one second doped layer 300 is formed on the first doped layer 200, and each second doped layer 300 is annealed. Only one second doped layer 300 is shown in FIG. 5, but is not limited thereto. By annealing the second doped layer 300, in one aspect, lattice mismatch and lattice defect in the second doped layer 300 can be repaired. In another aspect, the surface roughness of the second doped layer 300 can be improved, such that the grain growth on the second doped layer 300 is more uniform, thereby preventing the sealing problem from occurring in the contact hole 110 after the second doped layer 300 is formed, and thus avoiding the formation of pores in the contact hole 110.

In an embodiment, a material of the second doped layer 300 may include polysilicon.

For example, steps of forming the second doped layer 300 may include: placing the substrate 100 on which the first doped layer 200 has been formed in the furnace body, then introducing silane into the furnace body to form the polysilicon layer on the surface of the first doped layer 200, and introducing the dopant gas into the furnace body simultaneously, to finally form the second doped layer 300.

In an embodiment, the polysilicon layer may be ion-doped by means of an ion implantation or diffusion process to form the second doped layer 300.

In an embodiment, the doping concentration of the second doped layer 300 may be in a range from $1*10^{20}$ cm$^{-2}$ to $4*10^{20}$ cm$^{-2}$. Under this doping concentration, the problem of poor surface roughness of the second doped layer 300 caused by lattice mismatch of polysilicon, uneven growth rate, etc. due to doping can be improved as much as possible.

In an embodiment, the first doped layer 200 may include P-type or N-type doping material.

After one second doped layer 300 is formed, nitrogen gas is introduced into the furnace body to anneal this second doped layer 300 before a next second doped layer 300 is formed. It should be noted that, in this embodiment, the formation of the second doped layer 300 and the annealing of the second doped layer 300 are completed in the same furnace body, such that the working efficiency can be improved. Moreover, introducing the nitrogen gas can ensure that the second doped layer 300 is not oxidized, thereby ensuring the conductivity of the second doped layer 300, and further improving the performance of the device.

In an embodiment, the annealing temperature of the second doped layer 300 is between 500° C. and 700° C., for example, between 550° C. and 650° C.; and the annealing time of the second doped layer 300 is between 0.5 h and 3 h, for example, between 1 h and 2 h. The temperature at which the second doped layer 300 is formed and the annealing temperature of the second doped layer 300 may be substantially the same, such that the formation and annealing of the second doped layer 300 may be completed within the same temperature range, and the operation steps are saved.

With continued reference to FIG. 5 and FIG. 6, the thickness of each second doped layer 300 is t2. The ratio of the thickness of each second doped layer 300 to the original pore of the contact hole 110 is between 20% and 30%. That is, t2/W=20% to 30%. For example, t2/W=25%.

The doping concentration of the first doped layer 200 is greater than that of the second doped layer 300, and the thickness of the second doped layer 300 is greater than that of the first doped layer 200. Thus, because the first doped layer 200 has a higher doping concentration, the contact resistance between the first doped layer 200 and the active area may be reduced; and the second doped layer 300 has a lower doping concentration. Therefore, the lattice mismatch of the polysilicon layer and the growth rate of the polysilicon may be improved. Moreover, because the first doped layer 200 has a higher doping concentration, the surface roughness of the first doped layer 200 is poorer. Therefore, the thickness of the first doped layer 200 is less than that of the second doped layer 300, such that the whole doped layer has good surface roughness, and meanwhile, the lattice mismatch of the whole doped layer may be reduced, thereby finally forming a good polysilicon filling effect, and preventing the pores from being formed in the contact hole 110 filled.

It is to be understood that, number of layers of the second doped layers 300 to be formed may be adjusted according to a depth-to-width ratio of the contact hole 110. For example, when the depth-to-width ratio of the contact hole 110 is less than 15, one to three layers of the second doped layers 300 may be formed.

Figure 7:
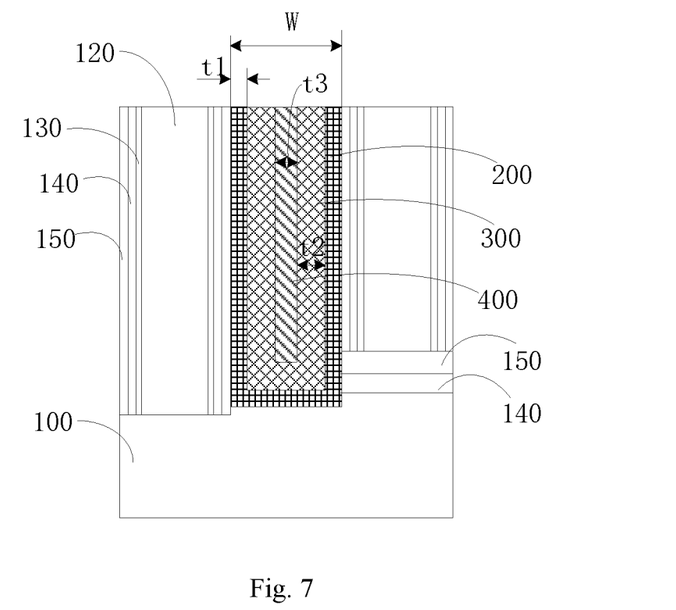

As shown in FIG. 7, the third doped layer 400 is formed on the second doped layer 300 to fill up the contact hole 110.

In an embodiment, a material of the third doped layer 400 may include polysilicon.

For example, steps of forming the third doped layer 400 may include: placing the substrate 100 on which the second doped layer 300 is formed in the furnace body, then introducing silane into the furnace body to form the polysilicon layer on the surface of the second doped layer 300, and introducing the dopant gas into the furnace body, to finally form the third doped layer 400.

In an embodiment, the polysilicon layer may be ion-doped by means of ion implantation or diffusion process to form the third doped layer 400.

In an embodiment, the doping concentration of the third doped layer 400 may be in a range from $4*10^{20}$ cm$^{-2}$ to $10*10^{20}$ cm$^{-2}$. It should be noted that, the conductivity of the polysilicon doped is positively correlated with the doping concentration. That is, the higher the doping concentration, the higher the conductivity. In addition, a higher doping concentration may lead to poor surface roughness of the doped layer formed. Therefore, under this medium doping concentration, the conductivity of the polysilicon and the surface roughness of the doped layer can both be taken into account.

In an embodiment, the third doped layer 400 may include P-type or N-type doping material.

With continued reference to FIG. 7, the thickness of the third doped layer 400 is t3. The ratio of the thickness of the third doped layer 400 to the original pore of the contact hole 110 is between 20% and 35%. That is, t3/W=20% to 35%. For example, t3/W=30%. That is, after the formation of one or more second doped layers 300, the dimension of the remaining pore of the contact hole 110 is at least greater than 20% of the original dimension, such that no pore having a larger depth-to-width ratio appears after the formation of the second doped layer 300, which is advantageous to forming a good filling effect. It should be noted that, the annealing treatment may also be performed after the formation of the third doped layer 400, such that a stress among the first doped layer 200, the second doped layer 300 and the third doped layer 400 may be improved.

Figure 8:
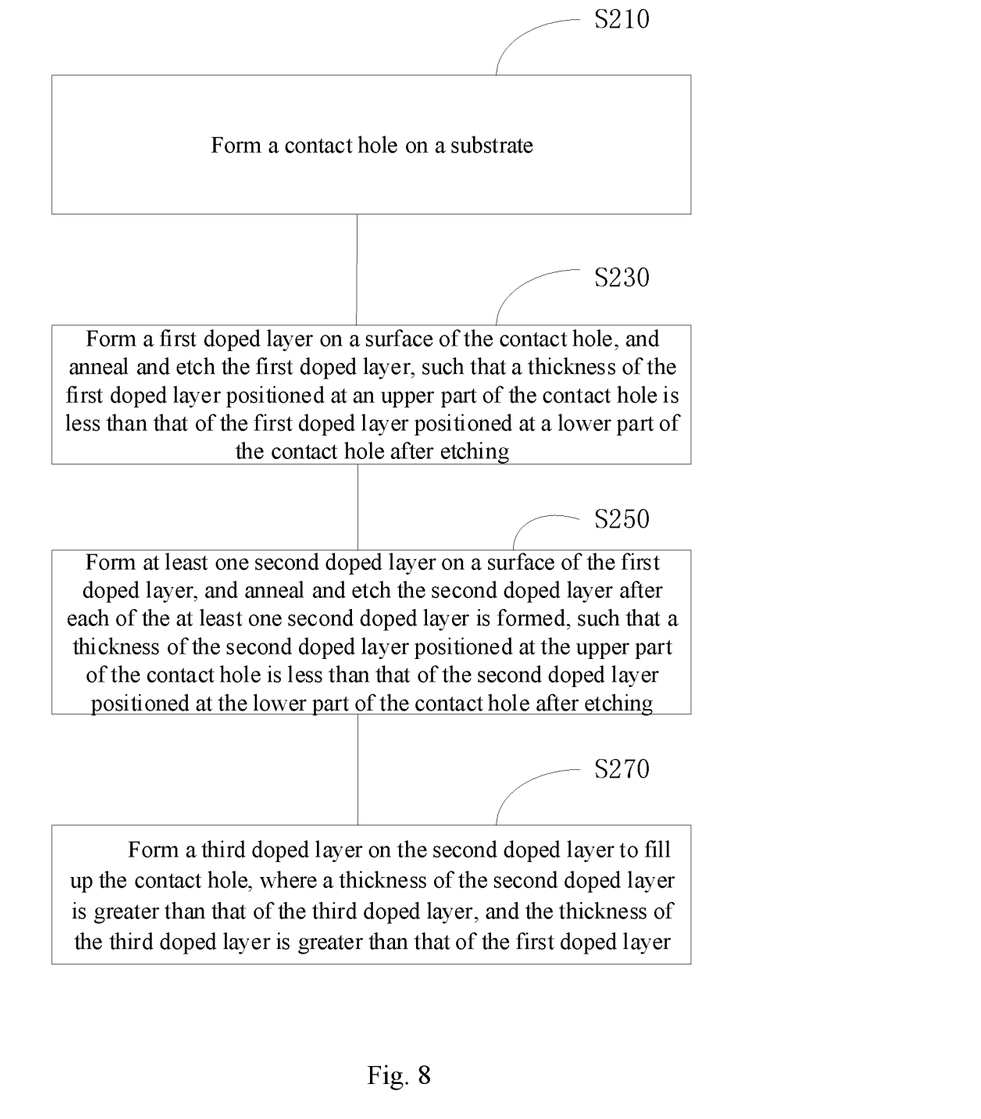
FIG. 8 is a flow diagram of a method for fabricating a semiconductor structure according to another embodiment of the present disclosure.

As shown in FIG. 8, FIG. 8 is a flow diagram of a method for fabricating a semiconductor structure according to another embodiment of the present disclosure. The method for fabricating the semiconductor structure according to the embodiments of the present disclosure includes following step.

Step S210: forming a contact hole on a substrate.

Step S230: forming a first doped layer on a surface of the contact hole, and annealing and etching the first doped layer, such that a thickness of the first doped layer positioned at an upper part of the contact hole is less than a thickness of the first doped layer positioned at a lower part of the contact hole after etching.

Step S250: forming at least one second doped layer on a surface of the first doped layer, and annealing and etching the at least one second doped layer after each of the at least one second doped layer is formed, such that a thickness of the at least one second doped layer positioned at the upper part of the contact hole is less than a thickness of the at least one second doped layer positioned at the lower part of the contact hole after etching.

Step S270: forming a third doped layer on the at least one second doped layer to fill up the contact hole.

A thickness of the at least one second doped layer is greater than a thickness of the third doped layer, and the thickness of the third doped layer is greater than a thickness of the first doped layer.

According to the method for fabricating the semiconductor structure provided by the embodiments of the present disclosure, on the basis of controlling a thickness relationship among the first doped layer 200, the second doped layer 300 and the third doped layer 400, after the first doped layer 200 is formed, the first doped layer 200 is etched; and after one second doped layer 300 is formed each time, the second doped layer 300 is etched. In this way, the first doped layer 200 and the second doped layer 300 etched respectively present a structure thinner at top and thicker at bottom, and the contact hole 110 presents a flared structure, which is advantageous to reducing a depth-to-width ratio of the contact hole 110, and finally implementing a good filling effect and avoiding formation of filling pores.

It should be noted that, contents of forming the first doped layer 200, the second doped layer 300 and the third doped layer 400 in the method for fabricating the semiconductor structure according to this embodiment of the present disclosure are basically the same as those in the above embodiment, and thus detailed descriptions thereof are omitted here. The method of this embodiment differs from that of the above embodiment in: respectively etching the first doped layer 200 and the second doped layer 300 after the first doped layer 200 and the second doped layer 300 are annealed.

Figure 9:
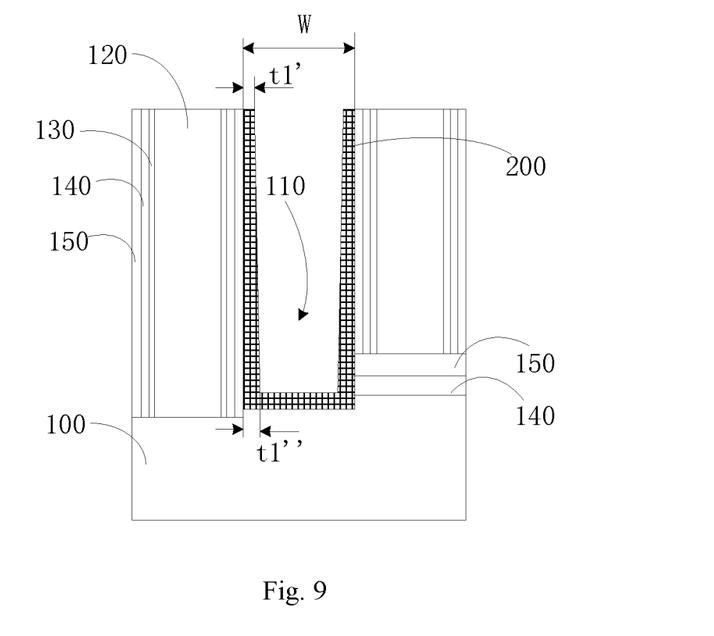
FIGS. 9 to 13 are schematic structural diagrams of steps of a method for fabricating a semiconductor structure according to yet another embodiment of the present disclosure.

As shown in FIG. 9, after the first doped layer 200 is annealed, the first doped layer 200 is etched. After etching, the thickness of the first doped layer 200 positioned at the upper part of the contact hole 110 is t1', t1'/t1=10% to 50%, and the thickness of the first doped layer 200 positioned at the lower part of the contact hole 110 is t1", t1"/t=70% to 90%.

By controlling an etching rate, the etching rate of the upper part of the contact hole 110 is greater than that of the lower part of the contact hole 110, such that the thickness of the upper part of the first doped layer 200 is less than that of the lower part of the first doped layer 200. In this way, finally the flared structure is formed, thereby reducing the depth-to-width ratio of the contact hole 110, which is advantageous to filling of polysilicon.

In an embodiment, the first doped layer 200 is etched, and the polysilicon may be etched by means of at least one of $CF_4$, HBr, $Cl_2$, and $Ar_2$. In this embodiment, the first doped layer 200 is etched by means of $Cl_2$ at a temperature between 280° C. and 380° C. and a pressure between 3 torr and 20 torr.

Figure 10:
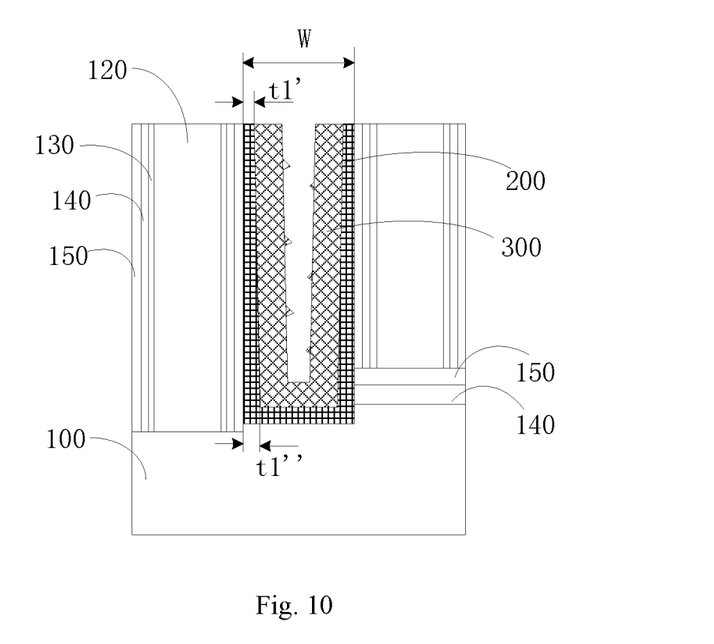
Figure 11:
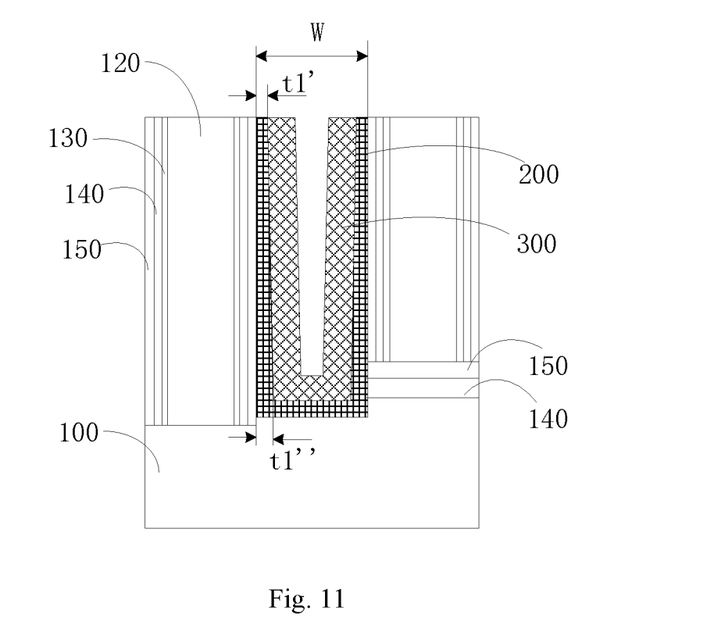
Figure 12:
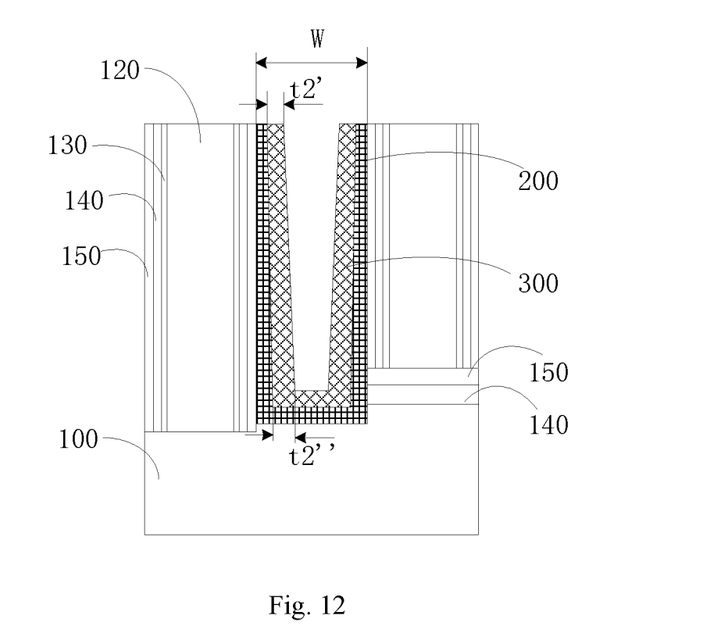

As shown in FIG. 10 to FIG. 12, at least one second doped layer 300 is formed on the surface of the first doped layer 200 etched, and the second doped layer 300 is annealed and etched after each second doped layer 300 is formed.

It should be noted that, the process steps of forming the second doped layer 300 and annealing the second doped layer 300 are basically the same as those in the above embodiment, so the method in this embodiment has all the advantages and beneficial effects in the above embodiment, and thus detailed descriptions thereof are omitted here.

As shown in FIG. 12, after one second doped layer 300 is formed and annealed, this second doped layer 300 is etched before a next second doped layer 300 is formed. After etching, the thickness of the second doped layer 300 positioned at the upper part of the contact hole 110 is t2', t2'/t2=10% to 50%; and the thickness of the second doped layer 300 positioned at the lower part of the contact hole 110 is t2', t2'/t2=70% to 90%.

By controlling an etching rate, the etching rate of the upper part of the contact hole 110 is greater than that of the lower part of the contact hole 110, such that the thickness of the upper part of the second doped layer 300 is less than that of the lower part of the second doped layer 300. In this way, finally the flared structure is formed, thereby reducing the depth-to-width ratio of the contact hole 110, which is advantageous to filling of polysilicon.

In an embodiment, the second doped layer 300 is etched, and the polysilicon may be etched by means of at least one of $CF_4$, HBr, $Cl_2$, and Are. In this embodiment, the second doped layer 300 is etched by means of $Cl_2$ at a temperature between 280° C. and 380° C. and a pressure between 3 torr and 20 torr. It should be noted that, after the first doped layer 200 or the second doped layer 300 is annealed, the etching gas is introduced into the furnace body, such that the first doped layer 200 or the second doped layer 300 may be etched. That is, the annealing and etching steps of the first doped layer 200 or the second doped layer 300 are all performed in the same furnace body, such that the operation steps may be simplified, and oxidation of the first doped layer 200 or the second doped layer 300 may also be avoided.

Figure 13:
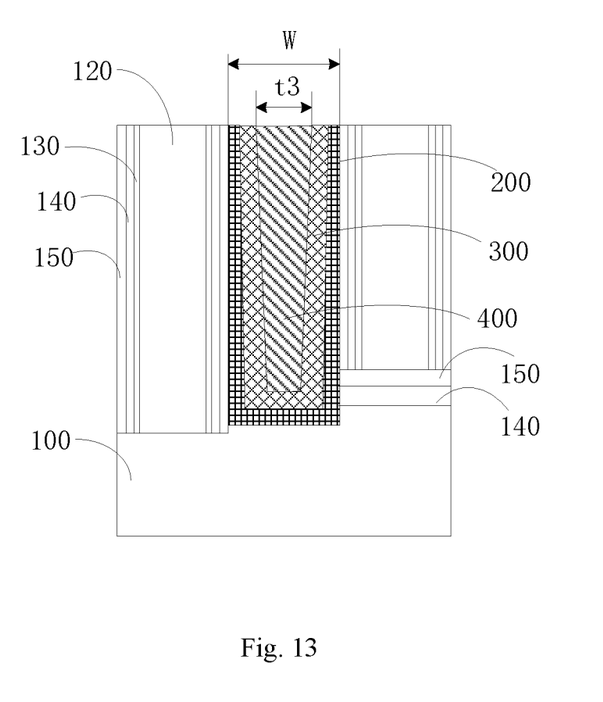

As shown in FIG. 13, the third doped layer 400 is formed on the second doped layer 300 to fill up the contact hole 110. The method for forming the third doped layer 400 is substantially the same as that in the above embodiment, which is not described herein again. It should be noted that, the annealing treatment may also be performed after the formation of the third doped layer 400, such that the stress among the first doped layer 200, the second doped layer 300, and the third doped layer 400 may be improved.

As shown in FIG. 13, the embodiments of the present disclosure also provide a semiconductor structure, which includes a substrate 100, a first doped layer 200, at least one second doped layer 300, and a third doped layer 400. The substrate 100 includes a contact hole 110, and the first doped layer 200 is provided on the surface of the contact hole 110, where the thickness of the first doped layer 200 positioned at the upper part of the contact hole 110 is smaller than that of the first doped layer 200 positioned at the lower part of the contact hole 110. At least one second doped layer 300 is disposed on the surface of the first doped layer 200, where the thickness of the second doped layer 300 positioned at the upper part of the contact hole 110 is smaller than that of the second doped layer 300 positioned at the lower part of the contact hole 110. The third doped layer 400 is disposed on the surface of the second doped layer 300 and fills up the contact hole 110, where the thickness of the third doped layer 400 positioned at the upper part of the contact hole 110 is greater than that of the third doped layer 400 positioned at the lower part of the contact hole 110. The thickness of the second doped layer 300 is greater than that of the third doped layer 400, and the thickness of the third doped layer 400 is greater than that of the first doped layer 200.

In an embodiment, the thickness of the first doped layer 200 formed on a side wall of the contact hole 110 gradually increases from top to bottom; the thickness of the second doped layer 300 formed on the side wall of the contact hole 110 gradually increases from top to bottom; and the thickness of the third doped layer 400 filled in the contact hole 110 gradually decreases from top to bottom.

In the embodiments of the present disclosure, terms such as "first", "second" and "third" are used only for purposes of description and are not understood to indicate or imply relative importance; and the term "a plurality of" refers to at least two, for example, unless otherwise explicitly stated. Terms such as "installation", "interconnection", "connection" or "fixation" should be understood in a broad sense. For example, the "connection" may be a fixed connection, a detachable connection or integrated connection; and the "interconnection" may be a direct interconnection or indirect interconnection by means of an intermediary. For those of ordinary skill in the art, concrete meanings of the above terms in the embodiments of the present disclosure may be understood based on concrete circumstances.

In the description of the embodiments of the present disclosure, it is to be understood that the orientations or positions represented by the terms of "up", "down", "left", "right", "front", "back", and the like are based on the orientations or positions as shown in the accompanying figures, they are merely for ease of a description of the embodiments of the present disclosure and a simplified description instead of being intended to indicate or imply the device or element to have a special orientation or to be configured and operated in a special orientation. Thus, they cannot be interpreted as limiting of the embodiments of the present disclosure.

In the descriptions of this specification, reference to the terms "one embodiment," "some embodiments," "an embodiment," means that a feature, structure, material, or characteristic described in connection with the embodiment or example is included in at least one embodiment or example of the present disclosure. The schematic representation of the above terms throughout this specification are not necessarily referring to the same embodiment or example. Furthermore, the features, structures, materials, or characteristics set forth may be combined in any suitable manner in any one or more embodiments or examples.

The above embodiments are merely some embodiments of the present disclosure, and are not intended to limit the embodiments of the present disclosure. To those skilled in the art, the embodiments of the present disclosure may have various alterations and variations. All modifications, equivalent substitutions and improvements made within the spirit and principle of the embodiments of the present disclosure shall fall within the protection scope of the embodiments of the present disclosure.

What is claimed is:

1. A method for fabricating a semiconductor structure, comprising:
    forming a contact hole on a substrate;
    forming a first doped layer on a surface of the contact hole, and annealing and etching the first doped layer, such that a thickness of the first doped layer positioned at an upper part of the contact hole is less than a thickness of the first doped layer positioned at a lower part of the contact hole after etching;
    forming at least one second doped layer on a surface of the first doped layer, and annealing and etching the at least one second doped layer after each of the at least one second doped layer is formed, such that a thickness of the at least one second doped layer positioned at the upper part of the contact hole is less than a thickness of the at least one second doped layer positioned at the lower part of the contact hole after etching; and
    forming a third doped layer on the at least one second doped layer to fill up the contact hole;
    wherein the thickness of the at least one second doped layer is greater than a thickness of the third doped layer, and the thickness of the third doped layer is greater than the thickness of the first doped layer.

2. The method for fabricating the semiconductor structure according to claim 1, wherein before the first doped layer is annealed and etched, a ratio of the thickness of the first doped layer to an original pore of the contact hole is between 5% and 12.5%;
    before the at least one second doped layer is annealed and etched, a ratio of the thickness of each of the at least one second doped layer to the original pore of the contact hole is between 20% and 30%; and
    a ratio of the thickness of the third doped layer to the original pore of the contact hole is between 20% and 35%.

3. The method for fabricating the semiconductor structure according to claim 1, wherein a ratio of the thickness of the first doped layer positioned at the upper part of the contact hole to an original thickness of the first doped layer is between 10% and 50%; and
    a ratio of the thickness of the first doped layer positioned at the lower part of the contact hole to the original thickness of the first doped layer is between 70% and 90%.

4. The method for fabricating the semiconductor structure according to claim 1, wherein a ratio of the thickness of the at least one second doped layer positioned at the upper part of the contact hole to an original thickness of the at least one second doped layer is between 10% and 50%; and
    a ratio of the thickness of the at least one second doped layer positioned at the lower part of the contact hole to the original thickness of the at least one second doped layer is between 70% and 90%.

5. The method for fabricating the semiconductor structure according to claim 1, wherein a doping concentration of the first doped layer is greater than a doping concentration of the third doped layer, and the doping concentration of the third doped layer is greater than a doping concentration of the at least one second doped layer.

6. The method for fabricating the semiconductor structure according to claim 5, wherein the doping concentration of the first doped layer is in a range of $8*10^{20}$ cm$^{-2}$ to $30*10^{20}$ cm$^{-2}$, the doping concentration of the at least one second doped layer is in a range of $1*10^{20}$ cm$^{-2}$ to $4*10^{20}$ cm$^{-2}$, and the doping concentration of the third doped layer is in a range of $4*10^{20}$ cm$^{-2}$ to $10*10^{20}$ cm$^{-2}$.

7. A semiconductor structure, comprising:
- a substrate comprising a contact hole;
- a first doped layer provided on a surface of the contact hole, wherein a thickness of the first doped layer positioned at an upper part of the contact hole is less than a thickness of the first doped layer positioned at a lower part of the contact hole;
- at least one second doped layer provided on a surface of the first doped layer, wherein a thickness of the at least one second doped layer positioned at the upper part of the contact hole is less than a thickness of the at least one second doped layer positioned at the lower part of the contact hole; and
- a third doped layer provided on a surface of the at least one second doped layer and filling up the contact hole, wherein a thickness of the third doped layer positioned at the upper part of the contact hole is greater than a thickness of the third doped layer positioned at the lower part of the contact hole;
- wherein the thickness of the at least one second doped layer is greater than a thickness of the third doped layer, and the thickness of the third doped layer is greater than the thickness of the first doped layer.

8. The semiconductor structure according to claim 7, wherein the thickness of the first doped layer formed on a side wall of the contact hole gradually increases from top to bottom;
- the thickness of the at least one second doped layer formed on the side wall of the contact hole gradually increases from top to bottom; and
- the thickness of the third doped layer filled in the contact hole gradually decreases from top to bottom.

9. The semiconductor structure according to claim 7, wherein a doping concentration of the first doped layer is greater than a doping concentration of the third doped layer, and the doping concentration of the third doped layer is greater than a doping concentration of the at least one second doped layer.

10. The semiconductor structure according to claim 9, wherein the doping concentration of the first doped layer is in a range of $8*10^{20}$ cm$^{-2}$ to $30*10^{20}$ cm$^{-2}$, the doping concentration of the at least one second doped layer is in a range of $1*10^{20}$ cm$^{-2}$ to $4*10^{20}$ cm$^{-2}$, and the doping concentration of the third doped layer is in a range of $4*10^{20}$ cm$^{-2}$ to $10*10^{20}$ cm$^{-2}$.

* * * * *